(12) United States Patent
Prajuckamol et al.

(10) Patent No.: US 9,967,986 B2
(45) Date of Patent: May 8, 2018

(54) SEMICONDUCTOR PACKAGE AND METHOD THEREFOR

(71) Applicant: SEMICONDUCTOR COMPONENTS INDUSTRIES, LLC, Phoenix, AZ (US)

(72) Inventors: Atapol Prajuckamol, Klaeng (TH); Chee Hiong Chew, Seremban (MY); Yushuang Yao, Seremban (MY)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 371 days.

(21) Appl. No.: 14/568,188

(22) Filed: Dec. 12, 2014

(65) Prior Publication Data

US 2015/0189772 A1    Jul. 2, 2015

Related U.S. Application Data

(60) Provisional application No. 61/923,156, filed on Jan. 2, 2014.

(51) Int. Cl.
*H05K 7/20* (2006.01)
*H05K 5/02* (2006.01)
(Continued)

(52) U.S. Cl.
CPC ......... *H05K 5/0213* (2013.01); *H01L 23/053* (2013.01); *H01L 23/40* (2013.01); *H01L 23/4006* (2013.01); *H01L 23/4093* (2013.01); *H05K 5/0221* (2013.01); *H01L 2924/0002* (2013.01); *Y10T 29/41* (2015.01)

(58) Field of Classification Search
CPC .. H01L 23/40; H01L 23/4006; H01L 23/4093
USPC ......... 361/717–719, 704; 257/706, 707, 712, 257/717, 718, 719, E23.181, E23.182, 257/E23.183, E23.188, E23.08, E23.083, 257/E23.084, E23.086
See application file for complete search history.

(56) References Cited

U.S. PATENT DOCUMENTS 6,245,186 B1 *  6/2001  Alcoe ................... H01L 21/563
                                                            156/297
7,450,389 B2    11/2008  Stolze et al.
(Continued)

FOREIGN PATENT DOCUMENTS

EP    0513410 A1    11/1992
EP    0718886 A1    6/1996

OTHER PUBLICATIONS

European Search Report dated Jun. 26, 2015, for counterpart European Patent Application No. EP 14199275, 2 pages.

*Primary Examiner* — Binh Tran
(74) *Attorney, Agent, or Firm* — Robert F. Hightower

(57) ABSTRACT

In one embodiment, a semiconductor package may be formed having a first side and a second side that is substantially opposite to the first side. An embodiment may include forming an attachment clip extending substantially laterally between the first and second sides wherein the attachment clip is positioned near a distal end of the first and second sides. An embodiment may also include forming the attachment clip to have a flexible main portion that can bend away from a plane of the main portion toward a bottom side of the semiconductor package.

19 Claims, 6 Drawing Sheets

(51) Int. Cl.
*H01L 23/053* (2006.01)
*H01L 23/40* (2006.01)
H01L 23/12 (2006.01)
H01L 23/34 (2006.01)

(56) References Cited

U.S. PATENT DOCUMENTS

| | | |
|---|---|---|
| 7,477,518 B2 | 1/2009 | Stolze et al. |
| 2007/0025086 A1 | 2/2007 | Huang et al. |
| 2009/0032931 A1 | 2/2009 | Kroneder |
| 2014/0285972 A1* | 9/2014 | Hong ................ H01L 23/4006 |
| | | 361/707 |

* cited by examiner

SEMICONDUCTOR PACKAGE AND METHOD THEREFOR

PRIORITY CLAIM TO PRIOR PROVISIONAL FILING

This application claims priority to prior filed Provisional Application No. 61/923,156 entitled "SEMICONDUCTOR PACKAGE" filed on Jan. 2, 2014, and having common inventors Atapol Prajuckamol et al. which is hereby incorporated herein by reference

BACKGROUND OF THE INVENTION

The present invention relates, in general, to electronics, and more particularly, to semiconductors, structures thereof, packages therefore, and methods of forming semiconductor devices.

In the past, the electronics industry utilized various methods and structures to form packages for semiconductor die or devices. Some packages were formed to accommodate several different die of various shapes. Some package types were formed to include attachment mechanisms for mechanically attaching the package to an underlying carrier such as a printed circuit board or a ceramic carrier. These carriers may or may not include a heat conducting element to which the package could be attached.

In some embodiments, the attachment mechanism did not provide a suitable contact between the package and the carrier to which the package was attached. The poor attachment could reduce heat transfer between the package and the carrier.

Accordingly, it is desirable to have a method of forming a package that facilitates an improved attachment mechanism, and/or that is configured to facilitate improved heat transfer between the package and the carrier.

Figure 1:
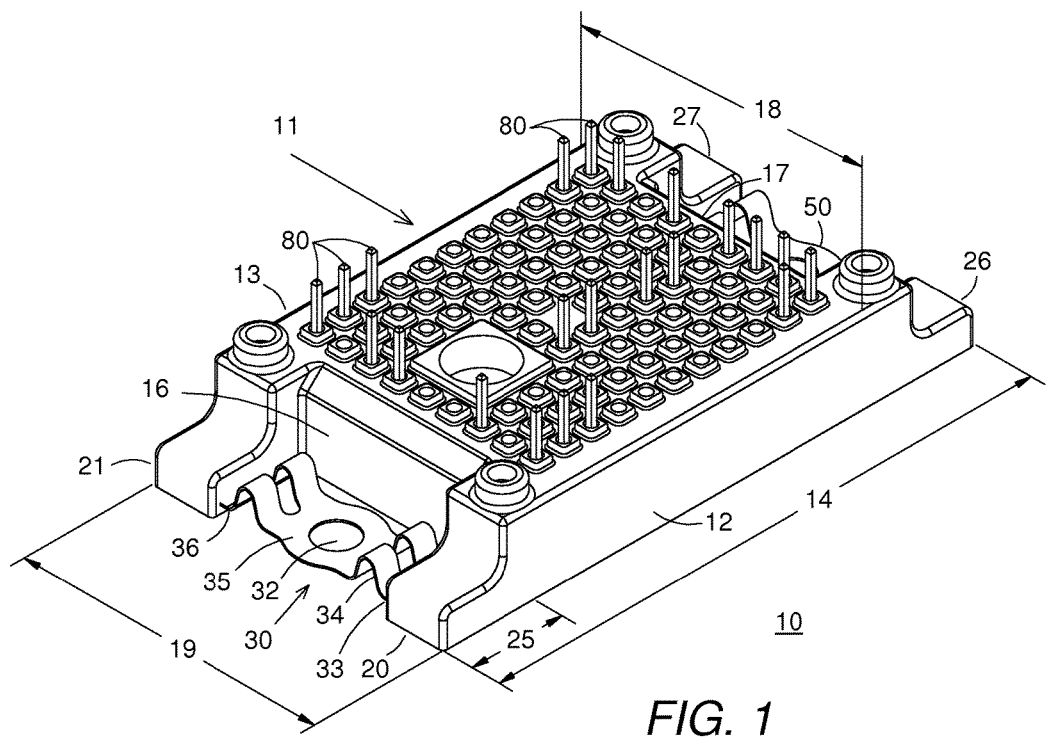
FIG. 1 illustrates a perspective view of an example of an embodiment of a portion of a package in accordance with the present invention.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements may be omitted for simplicity of the description. As used herein current carrying element or current carrying electrode means an element of a device that carries current through the device such as a source or a drain of an MOS transistor or an emitter or a collector of a bipolar transistor or a cathode or anode of a diode, and a control element or control electrode means an element of the device that controls current through the device such as a gate of an MOS transistor or a base of a bipolar transistor. Additionally, one current carrying element may carry current in one direction through a device, such as carry current entering the device, and a second current carrying element may carry current in an opposite direction through the device, such as carry current leaving the device. Although the devices may be explained herein as certain N-channel or P-channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments.

DETAILED DESCRIPTION OF THE DRAWINGS

FIG. 1 illustrates a perspective view of an example of an embodiment of a portion of a package 10 that is configured to house a semiconductor device (not shown) that includes a semiconductor substrate. As will be seen further hereinafter, package 10 is formed to include an attachment mechanism that provides improved contact between package 10 and a carrier to which package 10 may be attached. An embodiment may include that package 10 may also be formed to provide improved thermal transfer between package 10 and the carrier. In one embodiment, package 10 may house one or more mounting substrates onto which a semiconductor device or a semiconductor substrate or a semiconductor device housed in a semiconductor package may be mounted or attached. For example, package 10 may be formed to house a polymer substrate or a ceramic substrate (not shown) having conductors on and/or in the polymer or ceramic substrate. In an embodiment, package 10 may include a case portion or case 11 having an opening or recess 15 (FIG. 3) that is configured to house the semiconductor devices or to house the mounting substrate to which the semiconductor devices are attached. In an embodiment, case 11 and the majority of package 10 may be formed from plastic such as for example molded or formed plastic. Package 10 may also include terminals 80 that are used to form an electrical connection between elements outside of package 10 and the semiconductor devices housed within package 10.

Figure 2:
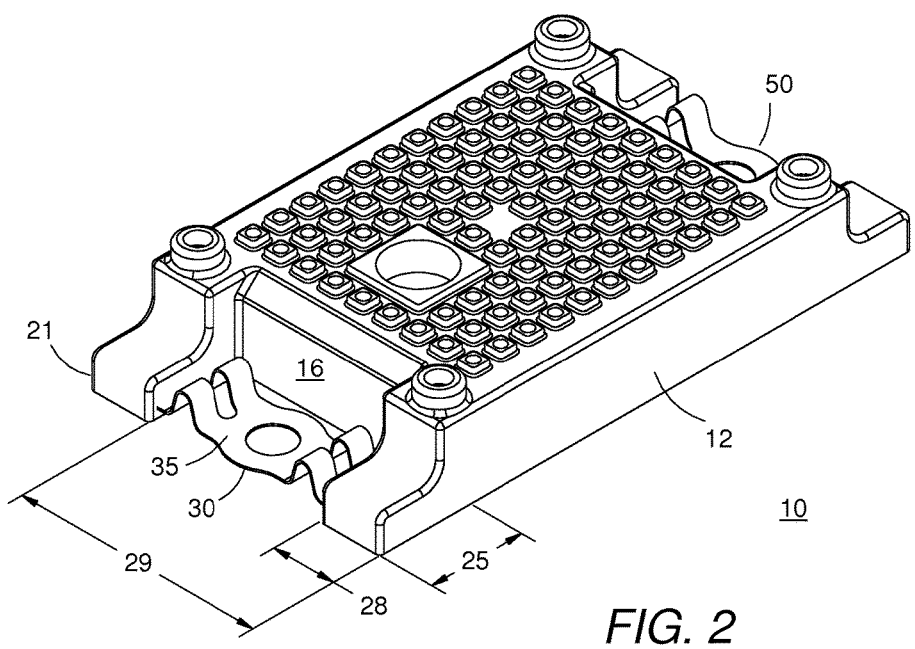
FIG. 2 illustrates a perspective view of an example of an embodiment of a portion of the package of FIG. 1 without terminals in accordance with the present invention.

FIG. 2 illustrates a perspective view of an example of an embodiment of a portion of a package 10 without terminals 80.

Figure 3:
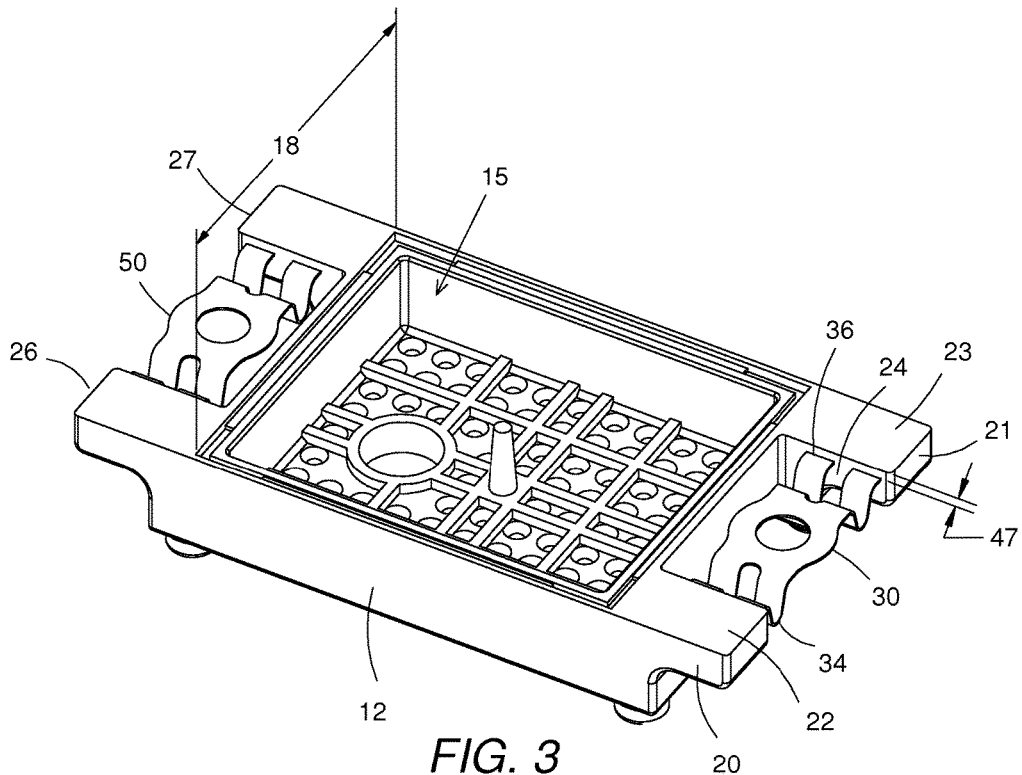
FIG. 3 illustrates a perspective view of an example of an embodiment of a bottom portion of the package of FIGS. 1-2 without terminals in accordance with the present invention.

FIG. 3 illustrates a perspective view of an example of an embodiment of a bottom portion of a package 10 including recess 15 and without terminals 80.

Figure 4:
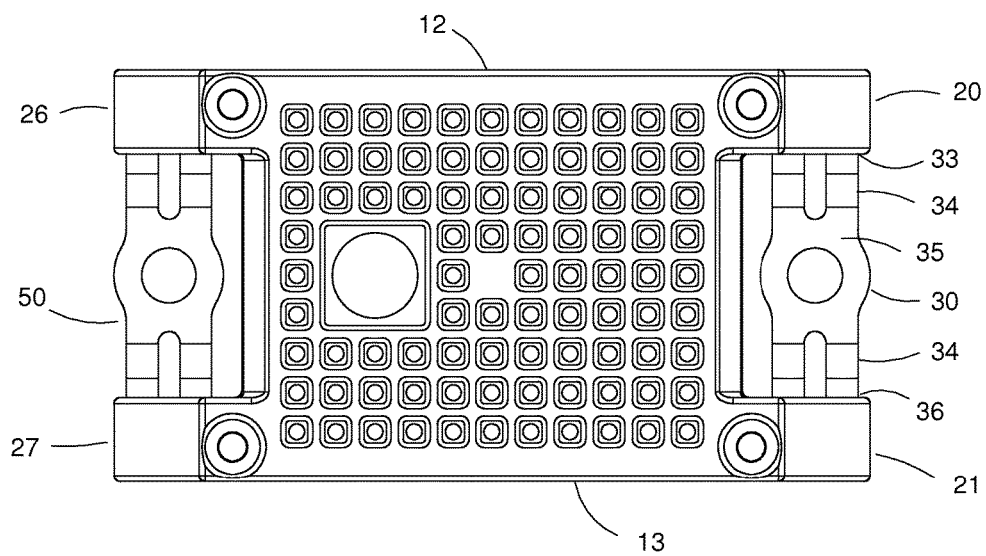
FIG. 4 illustrates a top plan view of an example of an embodiment of a portion of the package of FIGS. 1-3 without terminals in accordance with the present invention.

FIG. 4 illustrates a top plan view of an example of an embodiment of a portion of a package 10 without terminals 80.

Figure 5:
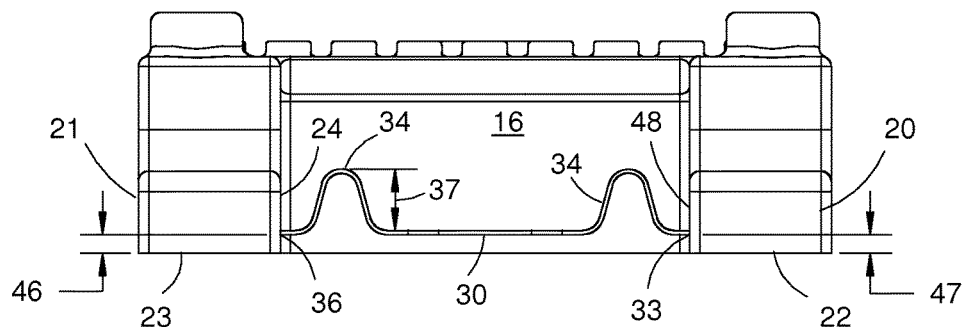
FIG. 5 illustrates a side elevation view of an example of an embodiment of an end portion of a portion of the package of FIGS. 1-4 without terminals in accordance with the present invention.

FIG. 5 illustrates a side elevation view of an example of an embodiment of an end portion of package 10 without terminals 80. This description has references to FIGS. 1-5.

In one embodiment, package 10 may be formed to include sides 12 and 13 that are opposite to each other and that extend along opposite sides of a length 14 of package 10. Sides 12 and 13 typically extend parallel to each other in an embodiment. Package 10 may also include sides 16 and 17 that are positioned, respectively, at opposite ends of package 10. Each of sides 16 and 17 may extend between sides 12 and 13 and each may have a first end that attaches to side 12 and a second end that attaches to side 13. An end of side 12 may be formed to include a foot portion or foot or projection portion or projection 20 that extends past side 16 and an opposite end of side 12 may be formed to include another foot portion or foot or projection portion or projection 26 that extends past side 17. Side 13 may similarly have one end that may be formed to include a foot portion or foot or projection portion or projection 21 that extends past side 16, and an opposite end of side 13 may be formed to include a foot portion or foot or projection portion or projection 27 that extends past side 17. Projections 20 and 26 may extend from opposite ends of side 12 past sides 16-17 and projections 21 and 27 may extend from opposite ends of side 13 past sides 16-17. Projections 20 and 21 may be formed to extend at an angle away from side 16 and projections 26 and 27 may be formed to extend at an angle away from side 17. In an embodiment, the angle may be substantially ninety degrees such that projections 20 and 21 extend substantially parallel to each other and substantially in the plane of respective sides 12 and 13, and such that projections 26 and 27 extend substantially parallel to each other and substantially in the plane of respective sides 12 and 13. In other embodiments, projections 20-21 and 26-27 may extend at different angles away from respective sides 16 and 17. In an embodiment, projection 20 extends a distance 25 from the plane of side 16. Projections 21, 26, and 27 may extend similar distances from the plane of the corresponding sides. In other embodiments, the projections may extend different distances from the plane of sides 16 and 17. An embodiment may include that case 11 is formed to have a width 18 that is substantially constant along length 14. In an embodiment, package 10 may be formed to have width 18 substantially constant along length 14. Thus, projections 20-21 and projections 26-27 would have a width between the outside edges of projections 20-21 and between the outside edges of projections 26-27 that is substantially width 18. In other embodiment, projections 20-12 and/or projections 26-27 may have widths that are different from width 18. An embodiment may include that projection 20 is formed to have a thickness or width 28 along the plane of side 16. In an embodiment, projections 21, 26, and 27 may be formed to have width 28, or alternately may have other widths in other embodiments. Width 28 may be greater than the width of sides 12 and 13 along the portion of sides 12 and 13 in case 11, in an embodiment. An interior distance 29 between the interior edges or interior sides 48 and 24 (FIG. 5), respectively, of projections 20 and 21 typically is formed to be less than width 18. In other embodiments, distance 29 may be greater than or may be equal to width 18. For example, projections 20 and 21 may extend away from side 16 at an angle that causes a distance 19 between the outside edges of projections 20-21 to be greater than width 18. In most embodiments, width 19 may be substantially the same as width 18.

Package 10 may be formed to include an attachment clip or clip 30 and an attachment clip or clip 50 that facilitate attaching package 10 to an underlying carrier. One example of such a carrier and attachment is illustrated, in a general manner, in FIG. 10. Projections 20-21 and 26-27 facilitate attaching respective clips 30 and 50 to package 10. In an embodiment, clip 50 may be substantially similar to clip 30 but positioned at a different location than clip 30. This description will refer mainly to clip 30 but such references to clip 30 also include clip 50 as attached to respective projections 26-27.

An embodiment may include that clip 30 is formed to bend without permanently deforming clip 30. Main portion 35 may be formed to bend without permanently deforming clip 30, in an embodiment. Clip 30 may be positioned between projections 20 and 21. Clip 30 may be formed to extend substantially laterally between sides 12 and 13 in an embodiment, and in another embodiment may be formed to extend substantially laterally between projections 20 and 21. In one embodiment, clip 30 has a first distal end 33 that is attached to foot 20 and a second distal end 36 that is attached to foot 21. In an embodiment, ends 33 and 36 may be attached to respective interior sides of respective projections 20 and 21 and positioned respective distances 46 (FIG. 5) and 47 away from respective bottom surfaces 22 and 23 of respective projections 20 and 21. In other embodiments, ends 33 and 36 may each be positioned at a different distance from surfaces 22 and 23. An embodiment may include that ends 33 and 36 extend past the interior sides of projections 21 and 21 and into the interior of respective projections 20 and 21. In one embodiment, the material of projections 20-21 may be formed around ends 33 and 36 as a portion of the step of forming projections 20 and 21 or the step of forming housing 11. For example, during the step of molding projections 20 and/or 21.

Figure 10:
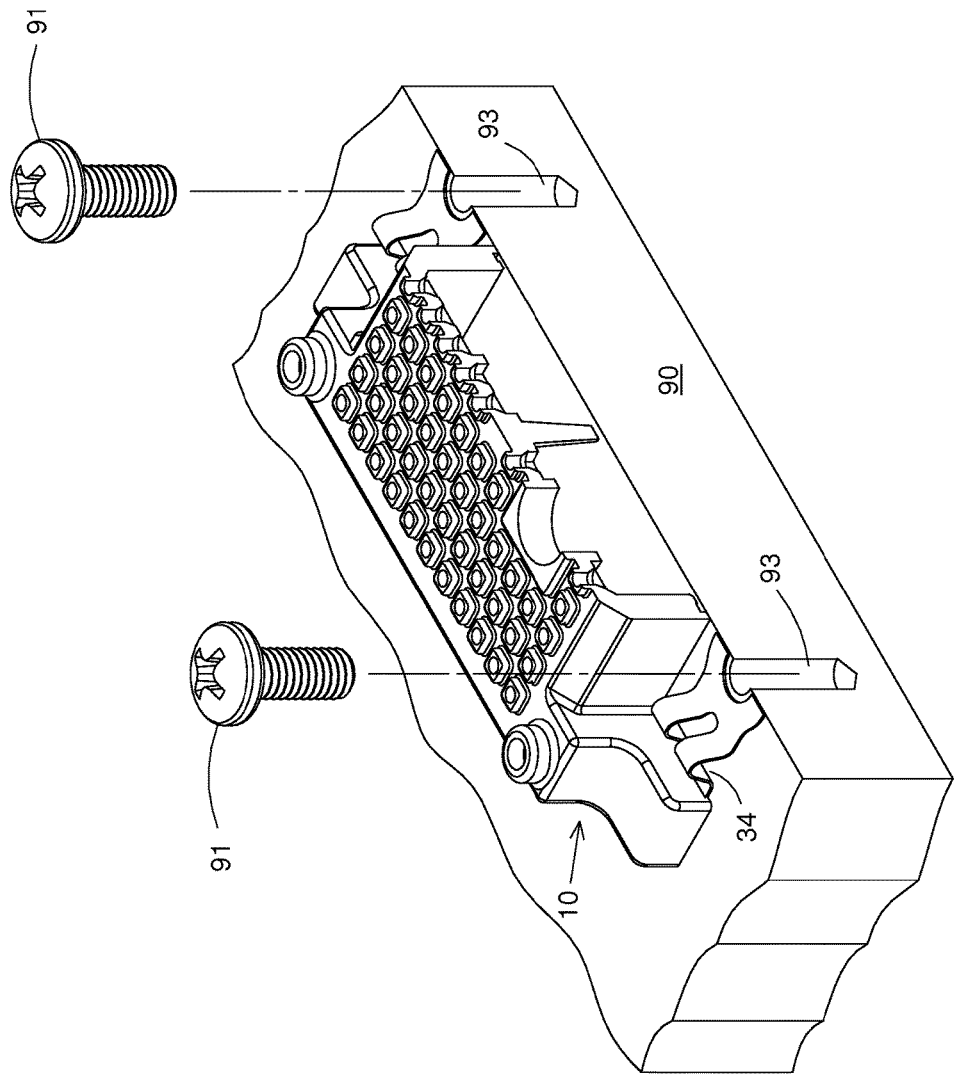
FIG. 10 illustrates, in a general manner, a cross-section of the package of FIGS. 1-5 mounted onto an underlying carrier in accordance with the present invention.

As illustrated in general in at least FIGS. 1 and 3, an embodiment of clip 30 may include a main portion 35 that extends between ends 33 and 36. An opening 32 may be formed through main portion 35. In some embodiments, opening 32 may be used to assist in attaching package 10 to the underlying carrier (FIG. 10). In one embodiment, opening 32 may have a circular shape but may have other shapes in other embodiments. In an embodiment, opening 32 may be positioned approximately in the center of main portion 35. Main portion 35 is not attached to side 16, in an embodiment. In some embodiments, a section of main portion 35 may have a width near or surrounding opening 32 that is greater than a width of a section of main portion 35 that is distal from opening 32.

Figure 11:
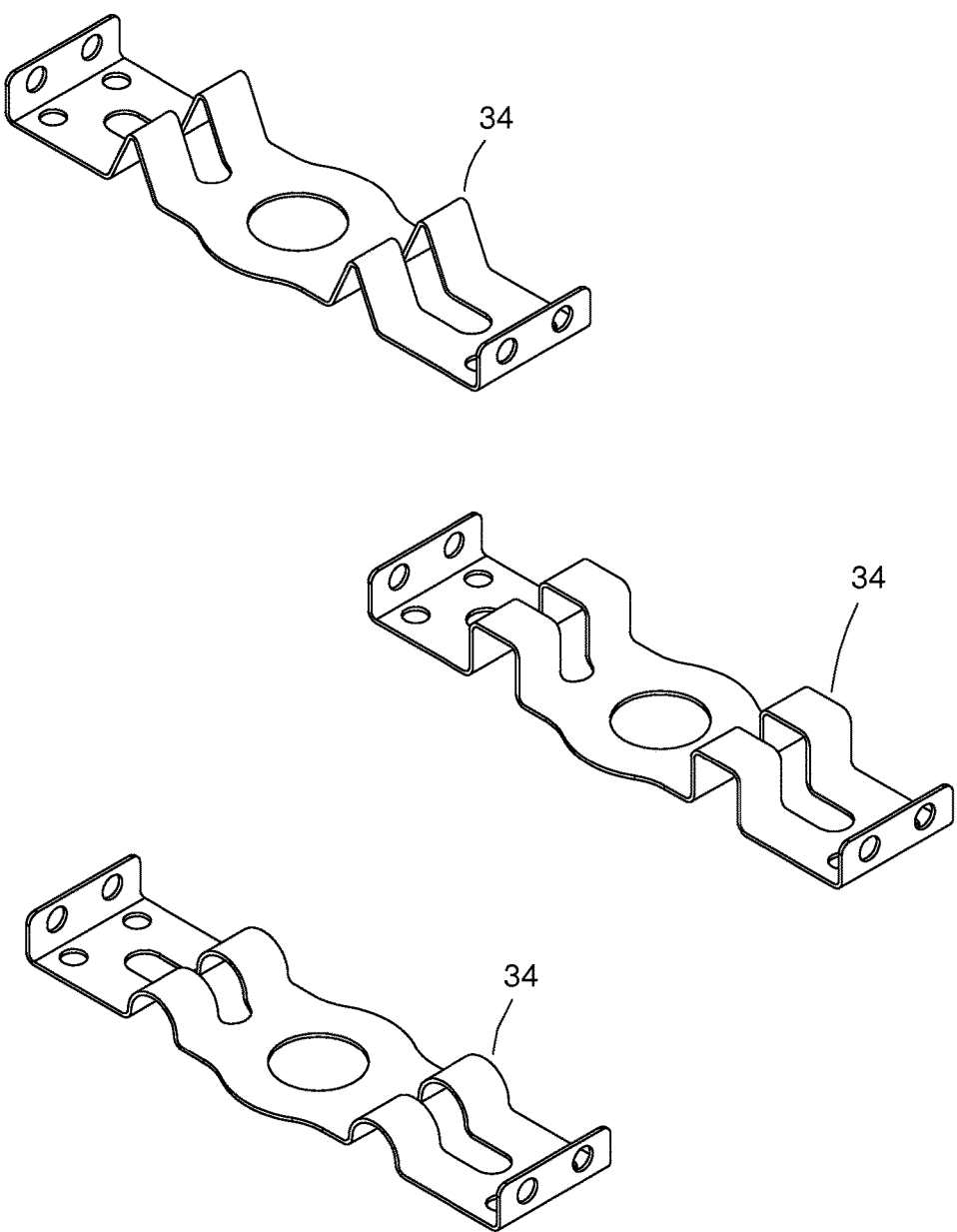
FIG. 11 illustrates some other examples embodiments of a loop of a clip of the package of FIGS. 1-5 in accordance with the present invention.

An embodiment of clip 30 may be formed to include a stamping or notch or loop 34, or a plurality of loops 34, that may be used for either improving the strength of clip 30 or for providing some amount of spring flexibility for clip 30. Loop 34 may be formed as a stamping or stamped portion of main portion 35 such as during the method of forming clip 30. Loop 34 may be formed as a section of main portion 35 that extends a distance away from the plane of main portion 35. For example, loop 34 may extend away from bottom surface 22-23 of projections 20-21. Loop 34 may be formed in a variety of shapes including a semi-circular shape, a "V" shape, a "U" shape, or as a three sided shape such as three sides of an open parallelogram. Example illustrations of examples of some other embodiments of loop 34 are illustrated in FIG. 11.

FIG. 10 illustrates, in a general manner, a cross-section of package 10 mounted onto an underlying carrier 90. Carrier 90 is illustrated only as a non-limiting vehicle to assist in explaining features of clip 30 and package 10. Carrier 90 may be a metal heat sink or a ceramic substrate that has conductors on a surface of the ceramic or a printed circuit board that has conductors on a surface or other type of carrier. An embodiment of carrier 90 may have holes 93 configured to mating accept screws 91, such as for example as illustrated by dashed lines. Clip 30 is formed to provide a force on package 10 that firmly mates or abuts package 10 to carrier 90 or to other carriers. In an embodiment, clips 30 and 50 extend between sides 12 and 13 facilitate clips 30 and 50 applying a more uniform force along length 14 of package 10 than was formed by prior packages. In an embodiment, loops 34 may provide spring action that allows clip 30 to bend and that may also assist in forming the more uniform force. For example, as screws 91 are inserted through opening 32 and screwed down to carrier 90, loops 34 allow clip 30 to bend as screw 91 is screwed into carrier 90. Thus, portions of clip 30 can move downward and clip 30 can provide downward force to firmly mate or abut the underside of package 10 to the top surface of carrier 90. Because an embodiment of clip 30 extends between sides 12 and 13, clip 30 distributes the downward force along width 18 and length 14 to provide a more uniform downward force to all of package 10. Those skilled in the art will understand that clip 30 can also move upwardly, such as during the removal of screw 91.

Referring back to FIGS. 1-5 and more particularly to FIG. 5, an embodiment of loops 34 may be formed to extend a distance 37 from the top surface of main portion 35 of clip 30. Distance 37 is selected based on distances 46-47 from the bottom surface of projections 20-21, and based on the amount of downward force to be applied to package 10. In an embodiment, distance 37 may be greater than at least the thickness of clip 30.

Figure 6:
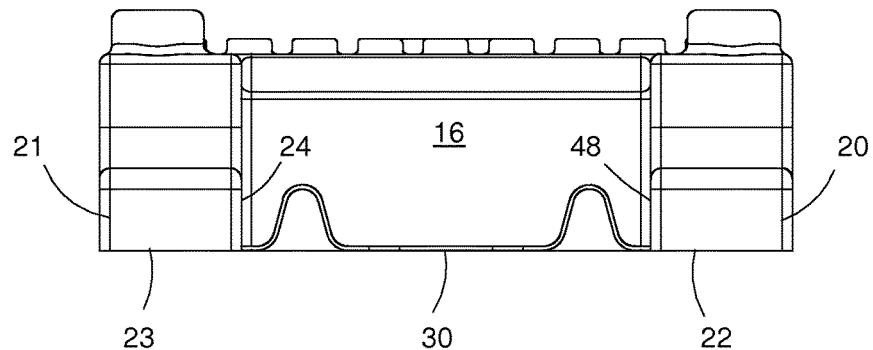
FIG. 6 illustrates another side elevation view of an example of an embodiment of an end portion of a portion an alternate embodiment of the package of FIGS. 1-5 in accordance with the present invention.

FIG. 6 illustrates another side elevation view of an example of an embodiment of an end portion of package 10 with clip 30 positioned at a different location of projections 20-21. For example, clip 30 may be positioned such that the value of distances 46-47 is different. Distances 46-47 may have a variety of values. The different distances provide different spring force values. For example, in an embodiment, clip 30 may be positioned near to bottom surfaces 22-23 of respective projections 20-21. For example, a bottom surface of clip 30 may be positioned near an intersection of an interior side 24 of projection 21 and surface 23. An embodiment may include that the bottom surface of clip 30 may be positioned substantially parallel to the intersection of side 24 and surface 23.

Figure 7:
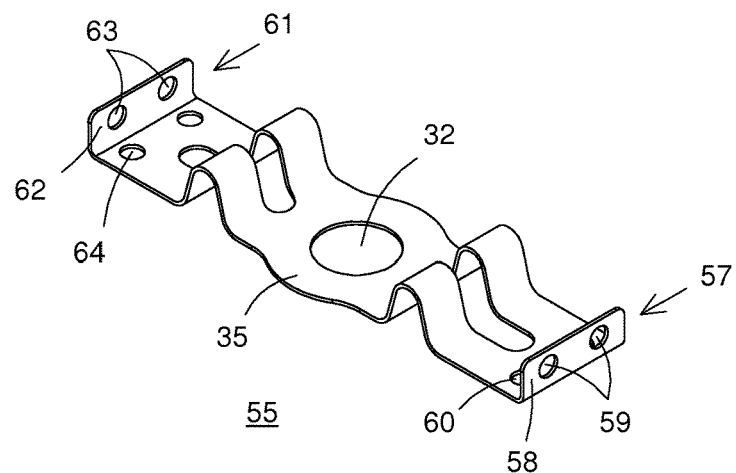
FIG. 7 illustrates a perspective view of an example of an embodiment of a portion of a clip that may be an alternate embodiment of a clip of the package of FIGS. 1-5 in accordance with the present invention.

FIG. 7 illustrates a perspective view of an example of an embodiment of a portion of a clip 55 that may be an alternate embodiment of clip 30 and/or clip 50. In an embodiment, clip 55 may be substantially the same as clips 30 or 50 except that clip 55 may have distal ends 57 and 61 that include respective bent portions 58 and 62. In one embodiment a portion of each end 57 and 61 is bent in a plane that is different from a plane of main portion 35 or in an alternate embodiment different from a plane of the respective distal ends 57 and 61. An embodiment may include that at least a portion of ends 57 and 61 have respective mold locks 60 and 64. In an embodiment, a portion of bent portions 58 and 62 may have mold locks 59 and 63, respectively. An embodiment may include that the mold locks are formed as openings in or alternately through the respective portions of clip 55. Those skilled in the art will appreciate that clip 30 may also have mold locks (not shown) in the portions of ends 33 and 36 that are interior to projections 20 and 21.

Figure 8:
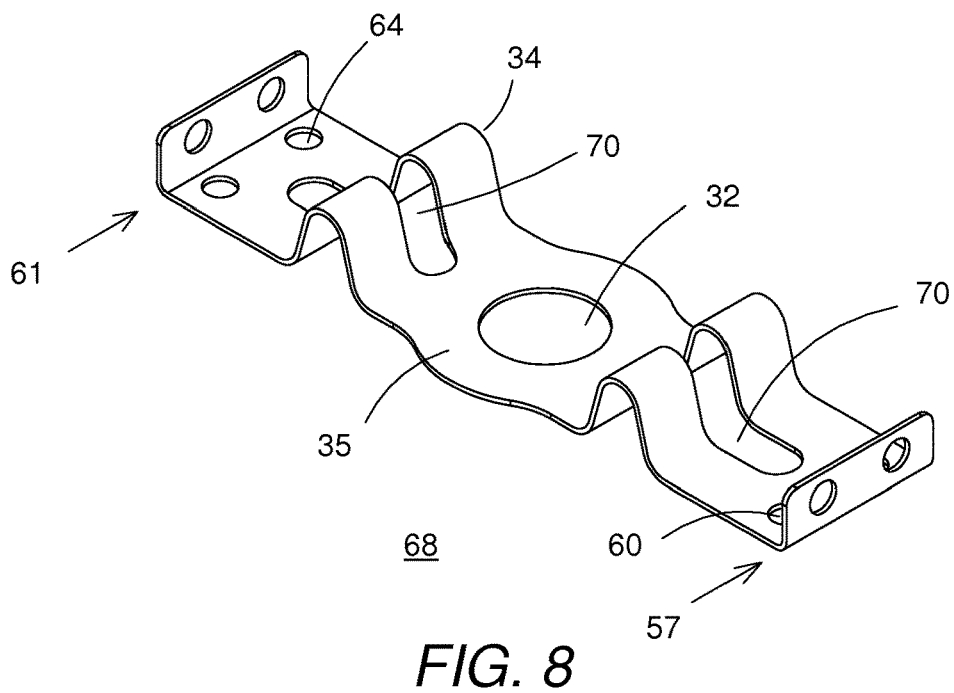
FIG. 8 illustrates a perspective view of an example of an embodiment of a portion of another clip that may be an alternate embodiment of a clip of the package of FIGS. 1-5 in accordance with the present invention.

FIG. 8 illustrates a perspective view of an example of an embodiment of a portion of a clip 68 that may be an alternate embodiment of clips 30, 50, or 55. In an embodiment, clip 68 may include an opening 70 or a plurality of openings 70 in main portion 35. Opening or openings 70 may be formed as a slot or a plurality of slots in main portion 35. An embodiment may include that opening(s) 70 may be formed in loops 34. In an embodiment, opening(s) 70 may have a length that is greater than a width of opening(s) 70. In an embodiment, opening(s) 70 may be formed in an elongated or oval shape in a portion of main portion 35 between opening 32 and ends 57 and 61. An embodiment of openings 70 may extend along the entire length of loop 34. Opening(s) 70 typically do not intersect opening 32. Opening(s) 70 may assist in providing flexibility to allow clip 68 to bend without permanently deforming clip 68. In another embodiment, opening(s) 70 may assist in providing spring force to clip 30. Those skilled in the art will appreciate that opening(s) 70 may be formed in any one of clips 30, 50, or 55.

Figure 9:
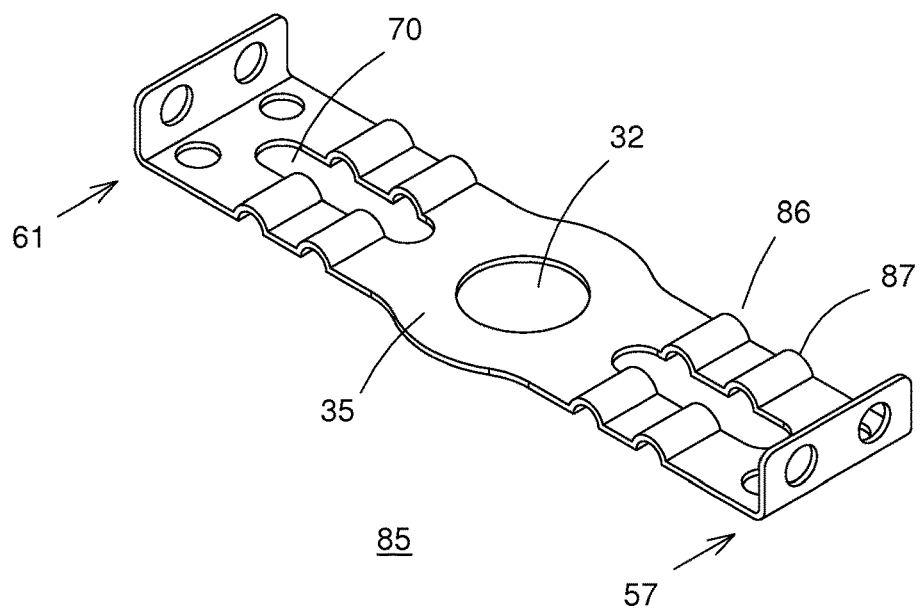
FIG. 9 illustrates a perspective view of an example of an embodiment of a portion of another clip that may be an alternate embodiment of a clip of the package of FIGS. 1-5 in accordance with the present invention.

FIG. 9 illustrates a perspective view of an example of an embodiment of a portion of a clip 85 that may be an alternate embodiment of any one of clips 30, 50, 55, and/or clip 68. Clip 85 is substantially the same as any one of clips 30, 50, 55, and/or clip 68 except that clip 85 includes a plurality of loops 86 and 87 in main portion 35 and positioned on each side of opening 32. Those skilled in the art will appreciate that loops 86-87 may be formed in any one of clips 30, 50, 55, or 68.

From all the foregoing, one skilled in the art will appreciate that an embodiment of a semiconductor package may comprise:

a housing having a first side, such as for example side 12;

a second side, such as for example side 13, opposite the first side;

a third side such as for example, site 16, extending at an angle from the first side toward the second side;

an interior portion configured for housing a semiconductor device formed on a semiconductor substrate;

a first projection, such as for example projection 20, portion of the first side extending from the first side a first distance, such as for example distance 25, past the third side;

a second projection, such as for example projection 21, portion of the second side extending from the second side a second distance past the third side; and a first attachment clip, such as for example clip 30, having a first end attached to the first projection portion and a second end attached to the second projection portion and having a main portion, such as for example portion 35, that extends between the first and second ends.

In an embodiment, the first attachment clip may have a loop, such as for example one of loops 34, in the main portion.

An embodiment may include that the attachment clip may extend laterally between the first projection portion and the second projection portion.

In an embodiment, the first projection portion may have a first interior side, such as for example side 24, oriented toward the second side and first bottom surface, such as for example bottom surface 22, extending away from the first interior side, the second projection portion having a second interior side oriented toward the first interior side and second bottom surface, such as for example bottom surface 23, extending away from the second interior side.

An embodiment may include that the first end of the first attachment clip may be attached a first distance, such as for example distance 46, away from the first bottom surface and wherein the second end of the first attachment clip may be attached a second distance away, such as for example a distance 47, from the second bottom surface.

An embodiment may include that the first distance may be substantially equal to the second distance.

In an embodiment, the first end of the first attachment clip may be attached substantially near an intersection of the first interior side and the first bottom surface and wherein the second end of the first attachment clip may be attached substantially near an intersection of the second interior side and the second bottom surface.

Another embodiment may include that the first attachment clip may have an opening, such as for example opening 32, through the main portion.

An embodiment may include that the opening may be one of a circle or a slot extending through the main portion.

In an embodiment, the opening may be between a plurality of loops, such as for example loops 34, in the main portion.

An embodiment of the semiconductor package may also include a fourth side, such as for example site 17, extending at an angle from the first side toward the second side;

a third projection, such as for example projection 26, extending from the first side a third distance past the fourth side;

a fourth projection, such as for example projection 27, extending from the second side a fourth distance past the fourth side; and a second attachment clip, such as for example clip 50, having a first end attached to the third projection and a second end attached to the fourth projection and a main portion that extends between the third and fourth sides.

Another embodiment may include that the first end and the second end may have mold locks internal to the respective first and second projections.

In an embodiment, the first end may be embedded into the first projection and the second end is embedded into the second projection.

Those skilled in the art will appreciate that a method of forming a semiconductor package may comprise:

forming a first side, such as for example side 12, of the package substantially parallel to a second side, such as for example site 13, of the package;

forming a first attachment clip, such as for example clip 30, extending between the first and second sides and positioned near a first end of the first and second sides wherein the first attachment clip is attached to the first and second sides;

forming a second attachment clip, such as for example clip 50, extending between the first and second sides and positioned near an opposite end of the first and second sides wherein the second attachment clip is attached to the first and second sides;

forming a first opening through the first attachment clip and forming a second opening through the second attachment clip; and forming a first loop in the first attachment clip and forming a second loop in the second attachment clip wherein the first loop is a portion of the first attachment clip that extends away from a plane of the first attachment clip and the second loop is a portion of the second attachment clip that extends away from a plane of the second attachment clip.

An embodiment of the method may also include forming the first loop between the first opening of the first attachment clip and a first distal end of the first attachment clip.

Another embodiment may include forming a third loop between the first opening of the first attachment clip and a second distal end of the first attachment clip.

In an embodiment, the method may include forming the second loop between the second opening of the second attachment clip and a first distal end of the second attachment clip.

Another embodiment may include forming the first attachment clip extending between a first projection, such as for example projection 20, of the first side and a first projection, such as for example projection 21, of the second side, and forming the second attachment clip extending between a second projection, such as for example projection 26, of the first side and a second projection, such as for example projection 27, of the second side.

Those skilled in the art will appreciate that a method of forming a semiconductor package may comprise:

forming a package having a first side and a second side that is substantially opposite to the first side;

forming an attachment clip extending substantially laterally between the first and second sides wherein the attachment clip is positioned near a distal end of the first and second sides;

forming the attachment clip to have a flexible main portion that can bend away from a plane of the main portion toward a bottom side of the semiconductor package.

Another embodiment of the method may include forming a loop in the main portion of the attachment clip wherein the loop is a first portion of the flexible main portion that is formed to extend away from the flexible main portion and away from the bottom of the package.

An embodiment may include forming an opening, such as for example opening 32, in the flexible main portion and positioned with the loop, such as for example loop 34, between the opening and a distal end, such as for example one of ends 33 or 36, of the attachment clip.

Another embodiment may include forming an opening, such as for example opening 70, in the loop wherein the opening has a length that is greater than a width of the opening.

In view of all of the above, it is evident that a novel device and method is disclosed. Included, among other features, is forming a semiconductor package that includes a clip configured for attaching the package to a carrier. The clip extends laterally between two adjacent sides of the package. The clip position facilitates the clip applying a downward force that assists in mating the package to the carrier. Loops may be formed in the clip to facilitate the clip bending during the attachment which may assist in forming the downward force.

While the subject matter of the descriptions are described with specific preferred embodiments and example embodiments, the foregoing drawings and descriptions thereof depict only typical and examples of embodiments of the subject matter and are not therefore to be considered to be limiting of its scope, it is evident that many alternatives and variations will be apparent to those skilled in the art.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A semiconductor package comprising:
   a housing having a first side;
   a second side opposite the first side;
   a third side extending at an angle from the first side toward the second side;
   an interior portion configured for housing a semiconductor device formed on a semiconductor substrate;
   a first projection portion of the first side extending from the first side a first distance past the third side;
   a second projection portion of the second side extending from the second side a second distance past the third side; and
   a first attachment clip having a first end attached to the first projection portion and a second end attached to the second projection portion and having a main portion that extends between the first and second ends wherein the first end and the second end are substantially co-planar to the main portion; and
   a loop in the main portion of the first attachment clip, the loop having a first portion extending from proximal to a central region of the main portion upwardly from the main portion and out of a plane of the main portion, the loop having a second portion extending from distal to the central region of the main portion and out of a plane of the main portion toward the first portion of the loop.

2. The semiconductor package of claim 1 wherein the loop extends upwardly from at least one of the first and second ends and out of a plane of at least one of the first end and the second end.

3. The semiconductor package of claim 1 wherein the attachment clip extends laterally between the first projection portion and the second projection portion.

4. The semiconductor package of claim 1 wherein the first projection portion has a first interior side oriented toward the second side and first bottom surface extending away from the first interior side, the second projection portion having a second interior side oriented toward the first interior side and second bottom surface extending away from the second interior side.

5. The semiconductor package of claim 4 wherein the first end of the first attachment clip is attached a first distance away from the first bottom surface and wherein the second end of the first attachment clip is attached a second distance away from the second bottom surface.

6. The semiconductor package of claim 5 wherein the first distance is substantially equal to the second distance.

7. The semiconductor package of claim 5 wherein the first end of the first attachment clip is attached substantially near an intersection of the first interior side and the first bottom surface and wherein the second end of the first attachment clip is attached substantially near an intersection of the second interior side and the second bottom surface.

8. The semiconductor package of claim 1 wherein the first attachment clip has an opening through the main portion.

9. The semiconductor package of claim 8 wherein the opening is one of a circle or a slot extending through the main portion.

10. The semiconductor package of claim 1 further including a fourth side extending at an angle from the first side toward the second side;
    a third projection extending from the first side a third distance past the fourth side;
    a fourth projection extending from the second side a fourth distance past the fourth side; and
    a second attachment clip having a first end attached to the third projection and a second end attached to the fourth projection and a main portion that extends between the third and fourth sides.

11. The semiconductor package of claim 1 wherein the first end and the second end have mold locks internal to the respective first and second projections.

12. The semiconductor package of claim 1 wherein the first end is embedded into the first projection and the second end is embedded into the second projection.

13. The semiconductor package of claim 1 wherein the central region of the main portion has a hole through the central region.

14. A semiconductor package comprising:
a housing having a first side;
a second side opposite the first side;
a third side extending at an angle from the first side toward the second side;
an interior portion configured for housing a semiconductor device formed on a semiconductor substrate;
a first projection portion of the first side extending from the first side a first distance past the third side;
a second projection portion of the second side extending from the second side a second distance past the third side; and
a first attachment clip having a first end attached to the first projection portion and a second end attached to the second projection portion and having a main portion that extends between the first and second ends wherein the first end and the second end are integrally molded into the respective first projection and second projection.

15. The semiconductor package of claim 14 wherein the first attachment clip has a loop in the main portion wherein the loop is a first portion of the main portion that is formed to extend upwardly from the main portion and out of a plane of the main portion, and upwardly from at least one of the first and second ends and out of a plane of at least one of the first end and the second end.

16. The semiconductor package of claim 14 wherein the first projection has a first bottom surface and the second projection has a second bottom surface and wherein the first end of the first attachment clip is attached substantially near the first bottom surface and wherein the second end of the first attachment clip is attached substantially near the second bottom surface.

17. A semiconductor package comprising:
a housing having a first side;
a second side opposite the first side;
a third side extending at an angle from the first side toward the second side;
an interior portion configured for housing a semiconductor device formed on a semiconductor substrate;
a first projection portion of the first side extending from the first side a first distance past the third side;
a second projection portion of the second side extending from the second side a second distance past the third side;
a first attachment clip having a first end attached to the first projection portion and a second end attached to the second projection portion and having a main portion that extends between the first and second ends;
a loop in the first attachment clip, the loop extending upward from a plane of the main portion wherein the loop is positioned between a center of the main portion and one of the first or second projection portions.

18. The semiconductor package of claim 17 wherein the loop is external from the first and second projection portions.

19. The semiconductor package of claim 17 wherein the loop returns to substantially the plane of the main portion.

* * * * *